United States Patent
Miura et al.

(10) Patent No.: US 6,806,855 B2
(45) Date of Patent: Oct. 19, 2004

(54) LIQUID CRYSTAL PANEL DRIVING CIRCUIT AND METHOD OF DRIVING A LIQUID CRYSTAL PANEL

(75) Inventors: Makoto Miura, Yamagata (JP); Fumihiko Kato, Yamagata (JP)

(73) Assignee: NEC Electronics Corporation, Kanagawa (JP)

( * ) Notice: Subject to any disclaimer, the term of this patent is extended or adjusted under 35 U.S.C. 154(b) by 280 days.

(21) Appl. No.: 09/977,293

(22) Filed: Oct. 16, 2001

(65) Prior Publication Data

US 2002/0044121 A1 Apr. 18, 2002

(30) Foreign Application Priority Data

Oct. 17, 2000 (JP) ........................................ 2000/316475

(51) Int. Cl.[7] ................................................ G09G 3/36
(52) U.S. Cl. ............................. 345/87; 345/90; 345/92; 345/99; 345/102
(58) Field of Search ............................... 345/87, 90.92, 345/102.99, 174; 257/99, 750; 330/252; 174/260; 313/582

(56) References Cited

U.S. PATENT DOCUMENTS

| | | | | |
|---|---|---|---|---|
| 5,525,937 A | * | 6/1996 | Kitazono et al. | 331/49 |
| 5,583,531 A | * | 12/1996 | Okada et al. | 345/89 |
| 5,610,414 A | * | 3/1997 | Yoneda et al. | 257/99 |
| 5,844,540 A | * | 12/1998 | Terasaki | 345/102 |
| 5,905,489 A | * | 5/1999 | Takahama et al. | 345/174 |
| 6,064,238 A | * | 5/2000 | Wight et al. | 327/58 |
| 6,075,413 A | * | 6/2000 | Katakura | 330/252 |
| 6,118,395 A | * | 9/2000 | Kim | 341/135 |
| 6,242,803 B1 | * | 6/2001 | Khandros et al. | 257/750 |
| 6,285,474 B1 | * | 9/2001 | Kawano et al. | 359/29 |
| 6,335,715 B1 | * | 1/2002 | Lee | 345/87 |
| 6,448,634 B1 | * | 9/2002 | Hashimoto | 257/668 |
| 6,473,067 B2 | * | 10/2002 | Maeda | 345/90 |
| 6,538,382 B2 | * | 3/2003 | Kimura et al. | 313/582 |
| 2002/0043400 A1 | * | 4/2002 | Shinohara | 174/260 |

FOREIGN PATENT DOCUMENTS

| | | |
|---|---|---|
| JP | 62-83724 | 4/1987 |
| JP | 1-297625 | 11/1989 |
| JP | 7-104704 | 4/1995 |
| JP | 11-282423 | 10/1999 |

OTHER PUBLICATIONS

Japanese Office Action dated Feb. 13, 2003, with partial English translation.

* cited by examiner

*Primary Examiner*—Vijay Shankar
*Assistant Examiner*—Prabodh M. Dharia
(74) *Attorney, Agent, or Firm*—McGinn & Gibb, PLLC (57) ABSTRACT

The present invention provides a liquid crystal panel driving circuit including an operational amplifier and a flexible substrate. The operational amplifier outputs an output signal based on an image signal and a feedback signal corresponding to the output signal without a high frequency content. In the flexible substrate with an inductance, the output signal passes through to a liquid crystal display via the inductance. The operational amplifier may include an operational amplifier element and a negative feedback circuit. The operational amplifier element includes a non-inverting input terminal supplied with the image signal, an inverting input terminal supplied with the feedback signal and an output terminal outputting the output signal. The negative feedback circuit formed between the output terminal and the inverting input terminal.

21 Claims, 9 Drawing Sheets

LIQUID CRYSTAL PANEL DRIVING CIRCUIT AND METHOD OF DRIVING A LIQUID CRYSTAL PANEL

BACKGROUND OF THE INVENTION

1. Field of the Invention

The present invention relates to a liquid crystal panel driving circuit. More particularly, the present invention relates to a liquid crystal panel driving circuit, in which a distortion of a wave form of an output or an oscillation of an operational amplifier for driving a liquid crystal panel that is caused by an influence of a self-inductance of a flexible substrate can be suppressed, when a flexible substrate is used as a medium through which a liquid crystal panel driving circuit and a liquid crystal panel are connected.

2. Description of the Related Art

A liquid crystal panel driving circuit is disposed at an input stage of a liquid crystal panel. This liquid crystal panel driving circuit has a plurality of operational amplifiers corresponding to the number of drive lines. A TFT type liquid crystal panel has transistors (TFTs) arrayed in a form of matrix. Each of the operational amplifiers of the liquid crystal panel driving circuit is connected to, for example, a source of this transistor by the first signal line. Then, the liquid crystal panel serving as a capacitance load is charged and discharged through this transistor. Incidentally, another second signal line is connected to a gate of the transistor. An on/off control of a predetermined transistor is carried out in accordance with an input signal through the second line.

Figure 8:
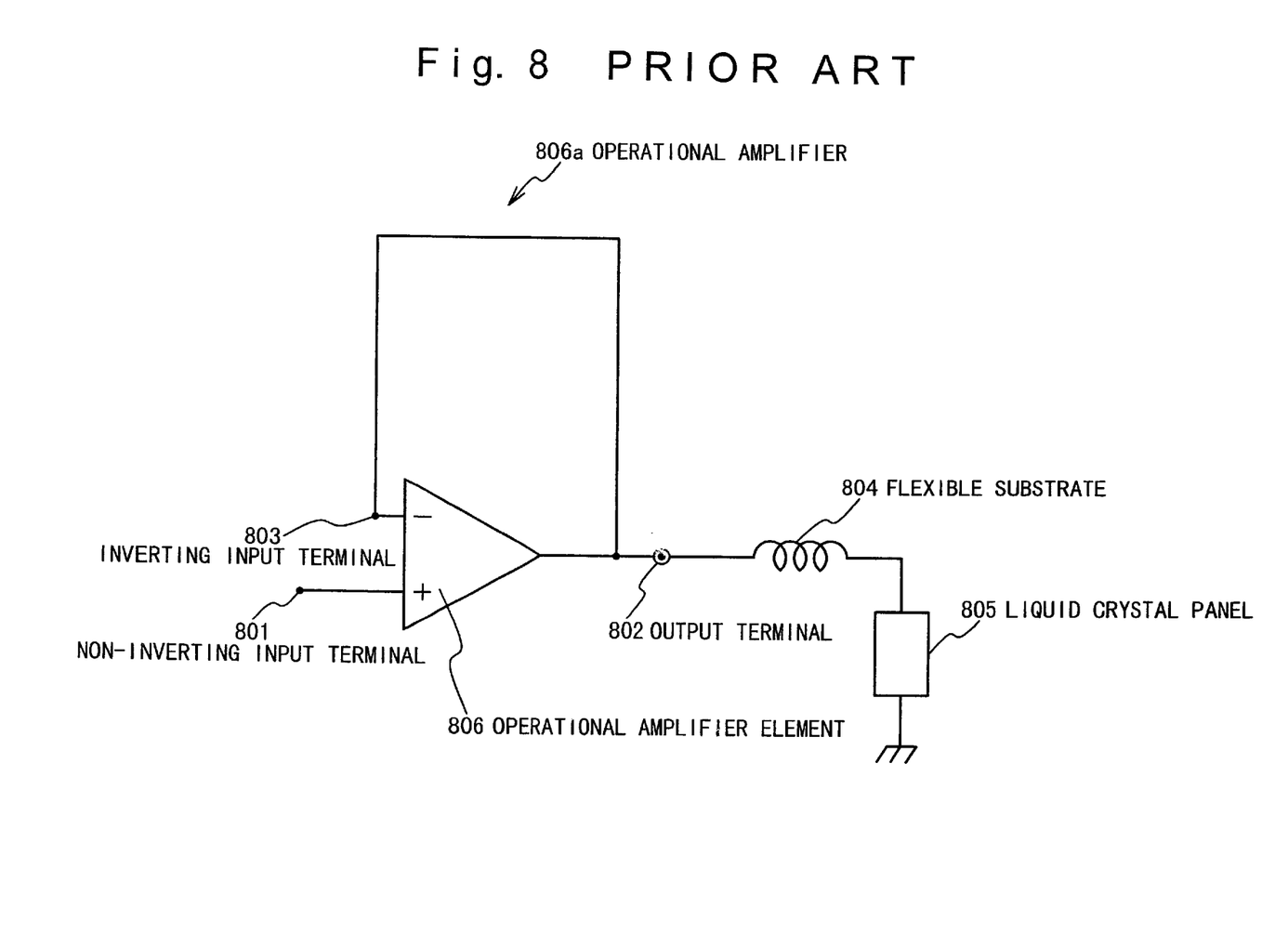
FIG. 8 is a view showing an arrangement of a conventional operational amplifier for a liquid crystal panel.

FIG. 8 is a view showing an arrangement of a conventional operational amplifier for a liquid crystal panel. As shown in FIG. 8, an operational amplifier 806a for a liquid crystal panel contains an operational amplifier element 806. The operational amplifier element 806 has a non-inverting input terminal 801 to receive an input signal. An output terminal 802 of the operational amplifier element 806 is connected as a voltage follower to an inverting input terminal 803 so as to form a negative feedback circuit. Typically, the output terminal 802 of the operational amplifier element 806 is connected through a flexible substrate 804 to a liquid crystal panel 805 serving as a load.

Figure 9:
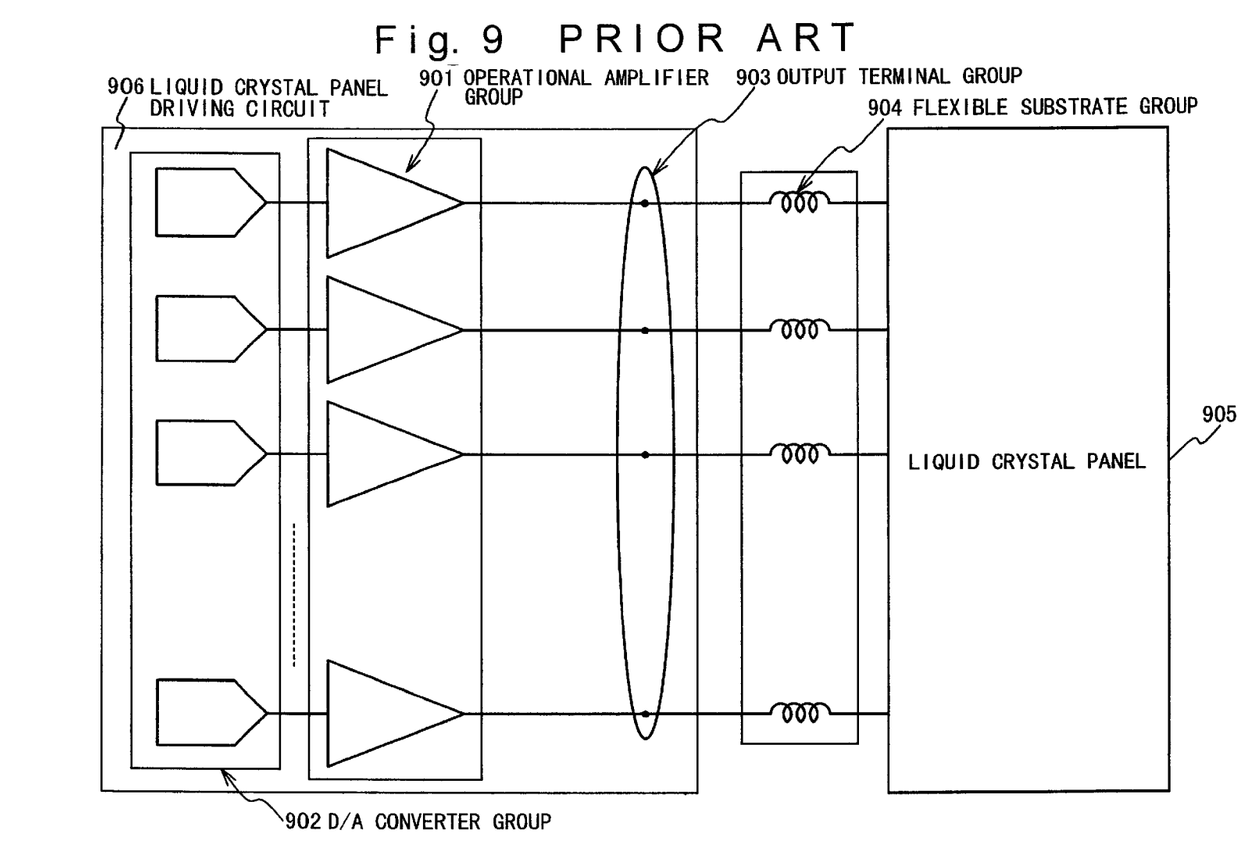
FIG. 9 is a conceptual view of a conventional liquid crystal panel driving circuit.

Here, the operation of the conventional liquid crystal panel driving circuit is described with reference to FIG. 9. FIG. 9 is a conceptual view of the conventional liquid crystal panel driving circuit. A liquid crystal panel driving circuit 906 shown in FIG. 9 is provided with: an operational amplifier group 901 composed of a plurality of operational amplifiers; a D/A converter group 902 composed of a plurality of D/A converters; and an output terminal group 903 composed of a plurality of output terminals. The D/A converter group 902 is connected to an input stage of the operational amplifier group 901.

The output terminal group 903 is connected to the liquid crystal panel 905 through a flexible substrate group 904 composed of a plurality of flexible substrates.

The operational amplifier group 901 is composed of the operational amplifiers 806a shown in FIG. 8. Thus, the output terminals of the respective operational amplifiers of the operational amplifier group 901 are connected as the voltage follower so as to form the negative feedback circuit.

The operational amplifier group 901 performs an impedance conversion on an analog signal outputted by the D/A converter group 902. The operational amplifier group 901 charges and discharges the liquid crystal panel 905 serving as the capacitance load, on the basis of the signal on which the impedance conversion is performed.

An invention in relation to a drive of a liquid crystal display using an operational amplifier, especially, an invention in relation to a power supply of a liquid crystal display driving circuit is disclosed in Japanese Laid Open Patent Application (JP-A-Showa, 62-83724). The technique disclosed in this gazette is the liquid crystal display driving circuit having the feature of protecting an oscillation of an operational amplifier by adding four resistors to a power supply circuit in which a six-level voltage is generated by using two kinds of power supplies, five resistors and four operational amplifiers. That is, this technique can protect a current increase caused by the oscillation of the operational amplifier. Incidentally, in order to protect the current increase, an output signal of the operational amplifier is outputted through the resistor and supplied to the liquid crystal panel.

Conventionally, the liquid crystal panel driving circuit has been optimally designed by referring to an equivalent circuit of a liquid crystal panel. However, if a reactance component of the flexible substrate is large, the inductance component causes high impedance to be generated in a high frequency band. This high impedance brings about the situation that a signal to be attenuated by the liquid crystal panel is fed back to the liquid crystal driving circuit 906 without any attenuation. For this reason, in the high frequency band, the influence of the high impedance causes the deterioration of the frequency property of the operational amplifier group 901. The deterioration of the frequency property results in the oscillation of the operational amplifier group 901.

Usually, the inductance component has a value of about 0.5 $\mu$H, although it is changed depending on the size of the liquid crystal panel. In the case of this condition, the input of a drive signal having a drive frequency of about 200 MHz may result in an occurrence of an oscillation.

SUMMARY OF THE INVENTION

The present invention has been made to solve the above-explained problems.

Therefore, an object of the present invention is to provide a liquid crystal panel driving circuit and a method of driving a liquid crystal panel, in which even if an inductance component is added between an operational amplifier and a liquid crystal panel, the operational amplifier is not oscillated.

Another object of the present invention is to provide a liquid crystal panel driving circuit and a method of driving a liquid crystal panel, in which even if an inductance component is added between an operational amplifier and a liquid crystal panel, a speed for driving the liquid crystal panel are not deteriorated.

Still another object of the present invention is to provide a liquid crystal panel driving circuit and method of driving a liquid crystal panel, in which even if an inductance component is added between an operational amplifier and a liquid crystal panel, a static current are not deteriorated.

In order to achieve an aspect of the present invention, the present invention provides a liquid crystal panel driving circuit including an operational amplifier which outputs an output signal based on an image signal and an feedback signal corresponding to the output signal without a high frequency content; and a flexible substrate with an inductance wherein the output signal pass through to a liquid crystal display via the inductance.

In the liquid crystal panel driving circuit, the operational amplifier may includes an operational amplifier element including a non-inverting input terminal supplied with the image signal, an inverting input terminal supplied with the feedback signal and an output terminal outputting the output signal; and a negative feedback circuit formed between the output terminal and the inverting input terminal.

In the liquid crystal panel driving circuit, the negative feedback circuit may include a low pass filter attenuating the high frequency content.

In the liquid crystal panel driving circuit, the low pass filter may includes a resistor connected between the inverting input terminal and the output terminal; and a capacitor connected between the inverting input terminal and an power supply.

In the liquid crystal panel driving circuit, the low pass filter may includes a plurality of resistors connected in series between the inverting input terminal and the output terminal; and a plurality of capacitors connected in parallel to each other through the resistors, wherein one end of the each of plurality of capacitors is connected to a connection point between the resistors and the other end of the each capacitor is connected to a power supply.

In the liquid crystal panel driving circuit, the low pass filter may further includes a plurality of switches, wherein the each of plurality of switches sets an active state and an inactive state of a corresponding one of the plurality of capacitors.

In the liquid crystal panel driving circuit, it may further includes a control circuit controlling an active state and an inactive state of the each switch so as to set a synthesis capacitance of the plurality of capacitors, based on the inductance of the flexible substrate.

In the liquid crystal panel driving circuit, it may further include D/A converter converting a digital image signal to an analog image signal as the image signal.

In order to achieve another aspect of the present invention, the present invention provides a method of driving a liquid crystal panel including (a) amplifying an image signal as a output signal, (b) supplying a liquid crystal display with the output signal; and (c) feeding back an feedback signal based on the output signal without a high frequency content.

In the method of driving a liquid crystal panel, (a) amplifying step includes (d) supplying an operational amplifier element with the image signal and the feedback signal; and (e) amplifying the image signal based on the image signal and the feedback signal by the operational amplifier element.

In the method of driving a liquid crystal panel, (b) supplying step includes (f) supplying the output signal that passes through a flexible substrate with an inductance to the liquid crystal display via the inductance.

In the method of driving a liquid crystal panel, (c) feeding back step includes (g) feeding back the feedback to the operational amplifier element, wherein the high frequency content signal is attenuated.

DESCRIPTION OF THE PREFERRED EMBODIMENTS

The embodiments of an operational amplifier for driving a liquid crystal panel according to the present invention and a liquid crystal panel driving circuit will be described below with reference to the attached drawings.

Figure 1:
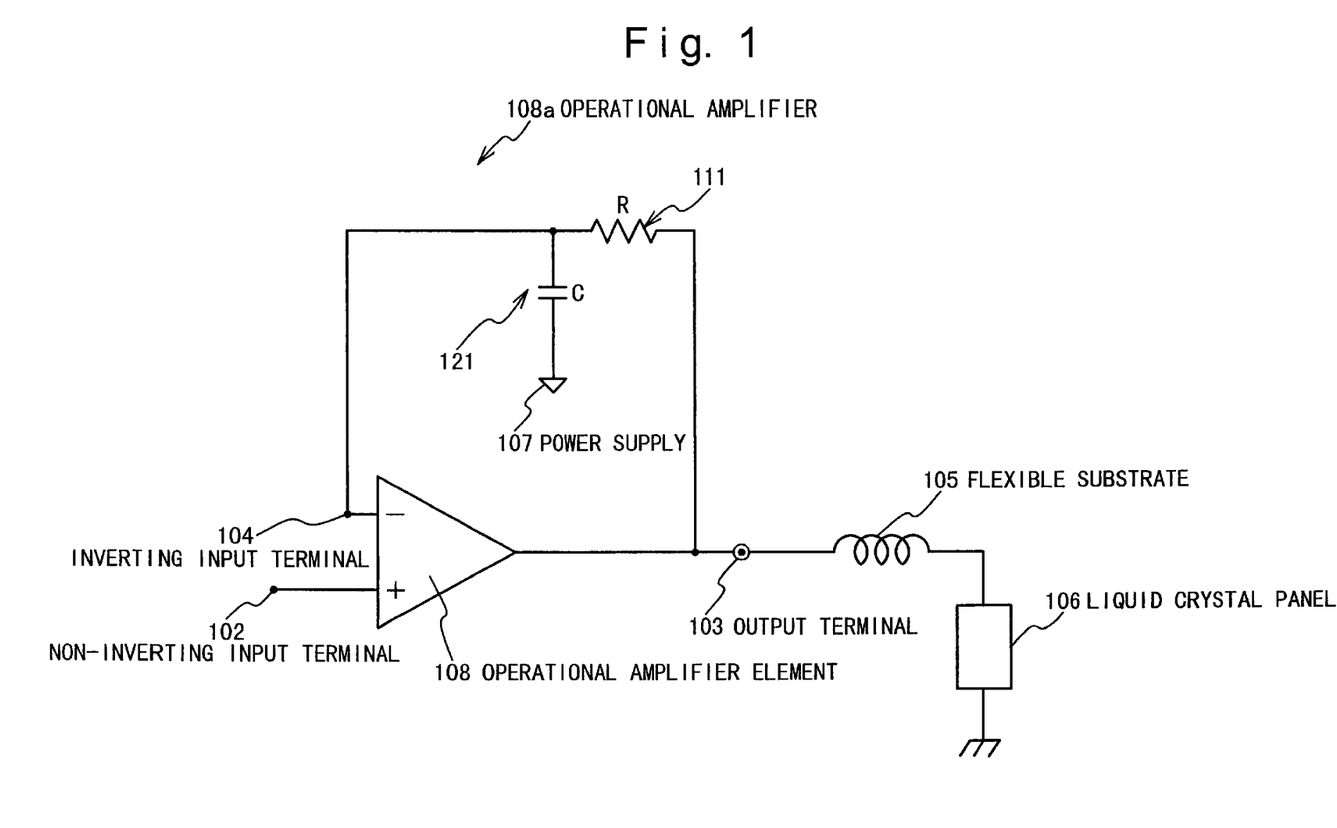
FIG. 1 is a view showing a configuration of an operational amplifier for driving a liquid crystal panel according to the first embodiment of the present invention.

FIG. 1 is a view showing the configuration of an operational amplifier for driving a liquid crystal panel, according to the first embodiment of the present invention.

An operational amplifier 108a shown in FIG. 1 is provided with an operational amplifier element 108, a resistor 111 and a capacitor 121. The operational amplifier element 108 is composed of a non-inverting input terminal 102, an output terminal 103 and an inverting input terminal 104.

The output terminal 103 is connected through the resistor 111 to the inverting input terminal 104. Moreover, the output terminal 103 is connected through the resistor 111 and the capacitor 121 to a power supply 107. A negative feedback circuit is constituted by the connection between the output terminal 103 and the inverting input terminal 104. The resistor 111 and the capacitor 121 constitute a so-called low pass filter.

As a value of the resistor 111, a value from several ten $\Omega$ to several hundred $\Omega$ is defined depending on a frequency of a drive signal and a value of an inductance. As a value of the capacitor 121, a value from several pF to several ten pF is defined depending on the frequency of the drive signal and the value of the inductance. If the frequency of the drive signal is, for example, about 200 MHz, a value of about 400 Ω is set for the resistor 111, and a value of about 2 pF is set for the capacitor 121.

A liquid crystal panel 106 is connected through a flexible substrate 105 to the output terminal 103.

In the operational amplifier 108a having the above-mentioned configuration, an output signal corresponding to a signal input to the non-inverting input terminal 102 is outputted from the output terminal 103. The output signal outputted from the output terminal 103 controls the operation for charging and discharging the liquid crystal panel 106 serving as a capacitance load, through the flexible substrate 105.

Incidentally, the feedback signal from the liquid crystal panel 106 is attenuated by the resistor 111 and the capacitor 121, and it does not reach the inverting input terminal 104. Conventionally, in a high frequency band, an inductance component of the flexible substrate 105 becomes high impedance. Therefore, the feedback signal to be attenuated in the liquid crystal panel 106 is not attenuated. However, in the present invention, the signal to be fed back is attenuated by the effects of the resistor 111 and the capacitor 121. Thus, the oscillation of the operational amplifier 108a (operational amplifier element 108) is prevented.

Figure 2:
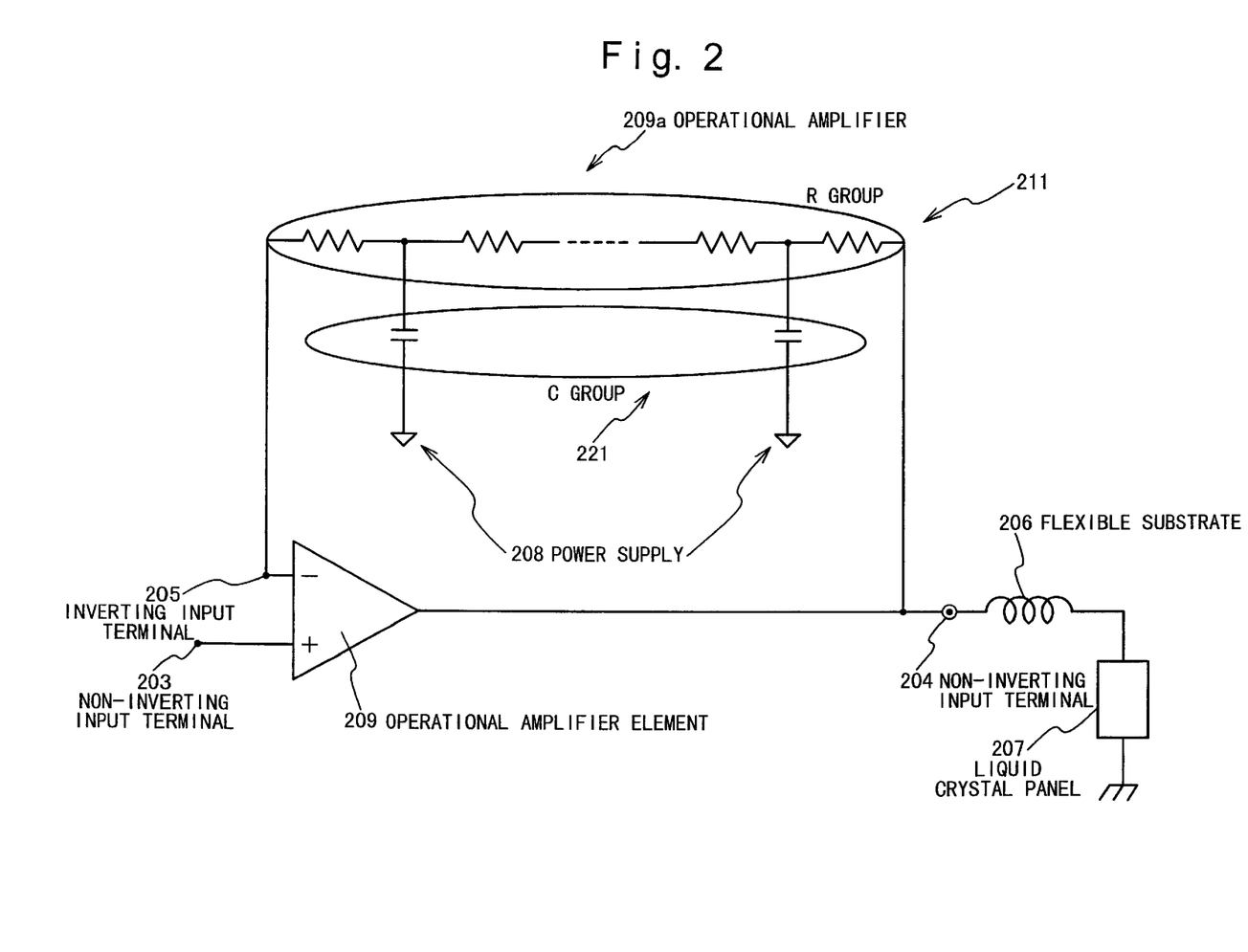
FIG. 2 is a view showing a configuration of an operational amplifier for driving a liquid crystal panel according to the second embodiment of the present invention.

The second embodiment of the operational amplifier according to the present invention will be described below with reference to FIG. 2. FIG. 2 is a view showing the configuration of an operational amplifier for driving a liquid crystal panel, according to the second embodiment of the present invention.

An operational amplifier 209a shown in FIG. 2 is provided with an operational amplifier element 209, a resistor group 211 and a capacitor group 221. The operational amplifier element 209 is composed of a non-inverting input terminal 203, an output terminal 204 and an inverting input terminal 205. The resistor group 211 is composed of a plurality of resistors connected in series with one after another (between the inverting input terminal 205 and the output terminal 204). The capacitor group 221 is composed of a plurality of capacitors connected in parallel to each other through the resistors.

The output terminal 204 is connected through the resistor group 211 to the inverting input terminal 205. Moreover, one end of each capacitor of the capacitor group 221 is connected to the connection point between the resistors. The other end of each capacitor is connected to a power supply 208.

A negative feedback circuit is formed by the connection between the output terminal 103 and the inverting input terminal 104. The resistor group 211 and the capacitor group 221 constitute a so-called low pass filter.

The output terminal 204 is connected through a flexible substrate 206 to a liquid crystal panel 207.

In the operational amplifier 209a having the above-mentioned configuration, an output signal corresponding to a signal input to the non-inverting input terminal 203 is outputted from the output terminal 204. The output signal outputted from the output terminal 204 controls the operation for charging and discharging the liquid crystal panel 207 serving as the capacitance load, through the flexible substrate 206.

Incidentally, the feedback signal from the liquid crystal panel 207 is attenuated by the resistor group 211 and the capacitor group 221, and it does not reach the inverting input terminal 205. Conventionally, in the high frequency band, an inductance component of the flexible substrate 206 becomes high impedance. Therefore, the feedback signal to be attenuated in the liquid crystal panel 207 is not attenuated. However, the signal to be fed back is attenuated by the effects of the resistor group 211 and the capacitor group 221. Thus, the oscillation of the operational amplifier 209a (operational amplifier element 209) is prevented.

Figure 3:
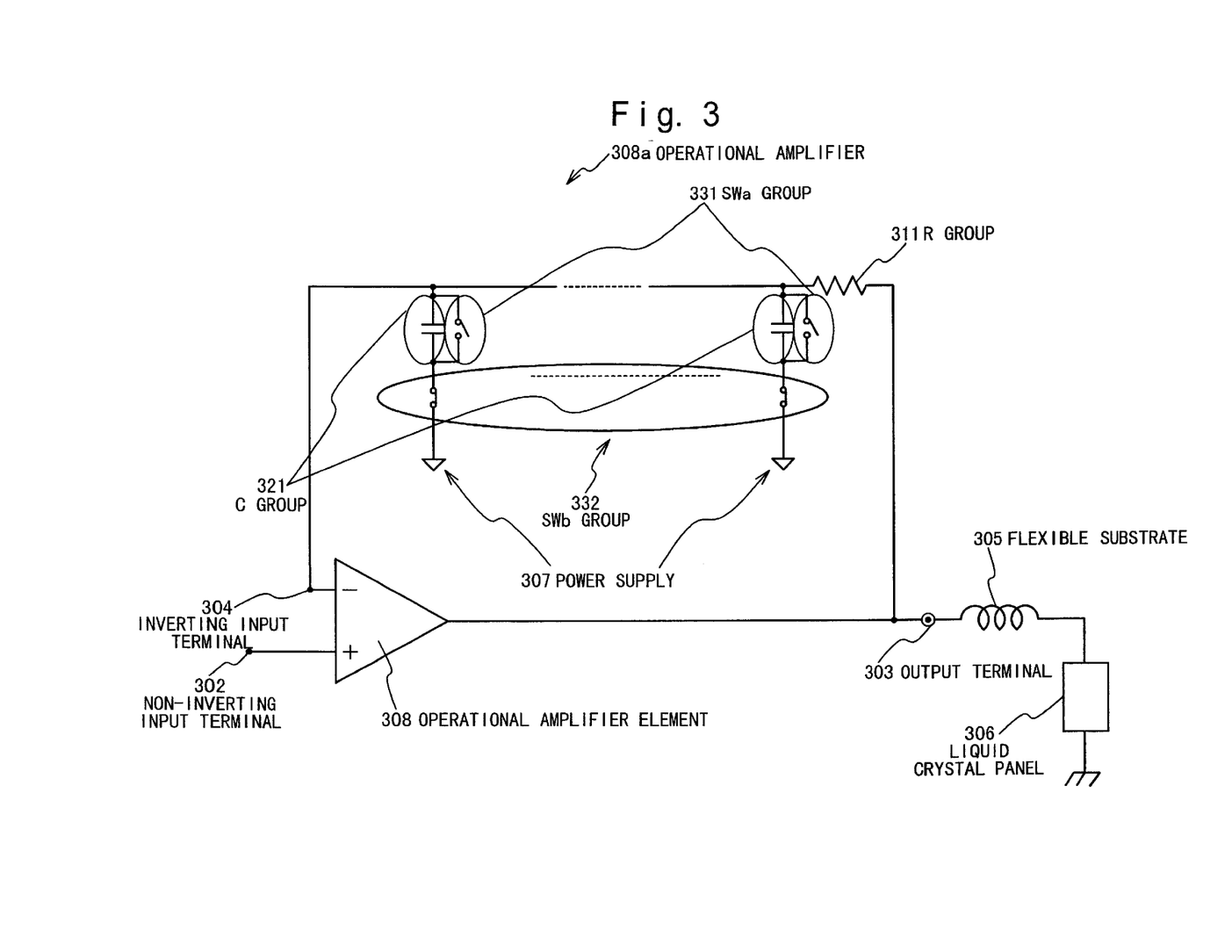
FIG. 3. is a view showing a configuration of an operational amplifier for driving a liquid crystal panel according to the third embodiment of the present invention.

The third embodiment according to the present invention will be described below with reference to FIG. 3. FIG. 3 is a view showing the configuration of an operational amplifier for driving a liquid crystal panel, according to the third embodiment of the present invention.

An operational amplifier 308a shown in FIG. 3 is provided with an operational amplifier element 308, a resistor group 311, a capacitor group 321, the first switch group (SWa) 331 and the second switch group (SWb) 332. The operational amplifier element 308 is composed of a non-inverting input terminal 302, an output terminal 303 and an inverting input terminal 304. The resistor group 311 is composed of a plurality of resistors connected in series with one after another (between the inverting input terminal 304 and the output terminal 303). The capacitor group 321 is composed of a plurality of capacitors. The first switch group 331 is composed of a plurality of switches. The second switch group 332 is composed of a plurality of switches.

The output terminal 303 is connected through the resistor group 311 to the inverting input terminal 304. The first switch corresponding in the first switch group 331 is connected in parallel to each capacitor of the capacitor group 221. One end of each capacitor is connected to the connection point between the resistors. The other end of each capacitor is connected through a second switch corresponding in the second switch group 332 to the power supply 307.

A negative feedback circuit is formed by the connection between the output terminal 303 and the inverting input terminal 304. The resistor group 311, the capacitor group 321, the first switch group 331 and the second switch group 332 constitute a so-called low pass filter.

The output terminal 303 is connected through a flexible substrate 305 to a liquid crystal panel 306.

In the operational amplifier 308a having the above-mentioned configuration, a signal input to the non-inverting input terminal 302 is outputted through the operational amplifier 308, and controls the operation for charging and discharging the liquid crystal panel load 306 serving as the capacitance load. As for a feedback signal from the liquid crystal panel 306, an attenuation amount is adjusted by the capacitor selected by the resistor group 311, the first switch group 331 and the second switch group 332. The feedback signal is attenuated in accordance with the attenuation in the resistor group 311 and the capacitor group 321. Incidentally, if the first switch is turned on, the corresponding second switch is turned off. Similarly, if the first switch is turned off, the corresponding first switch is turned on.

By suitably controlling the on/off operations of the first switch group 311 and the second switch group 332, the synthesis capacitance of the capacitor group 321 can be defined in accordance with the reactance value of the flexible substrate 305.

Figure 4:
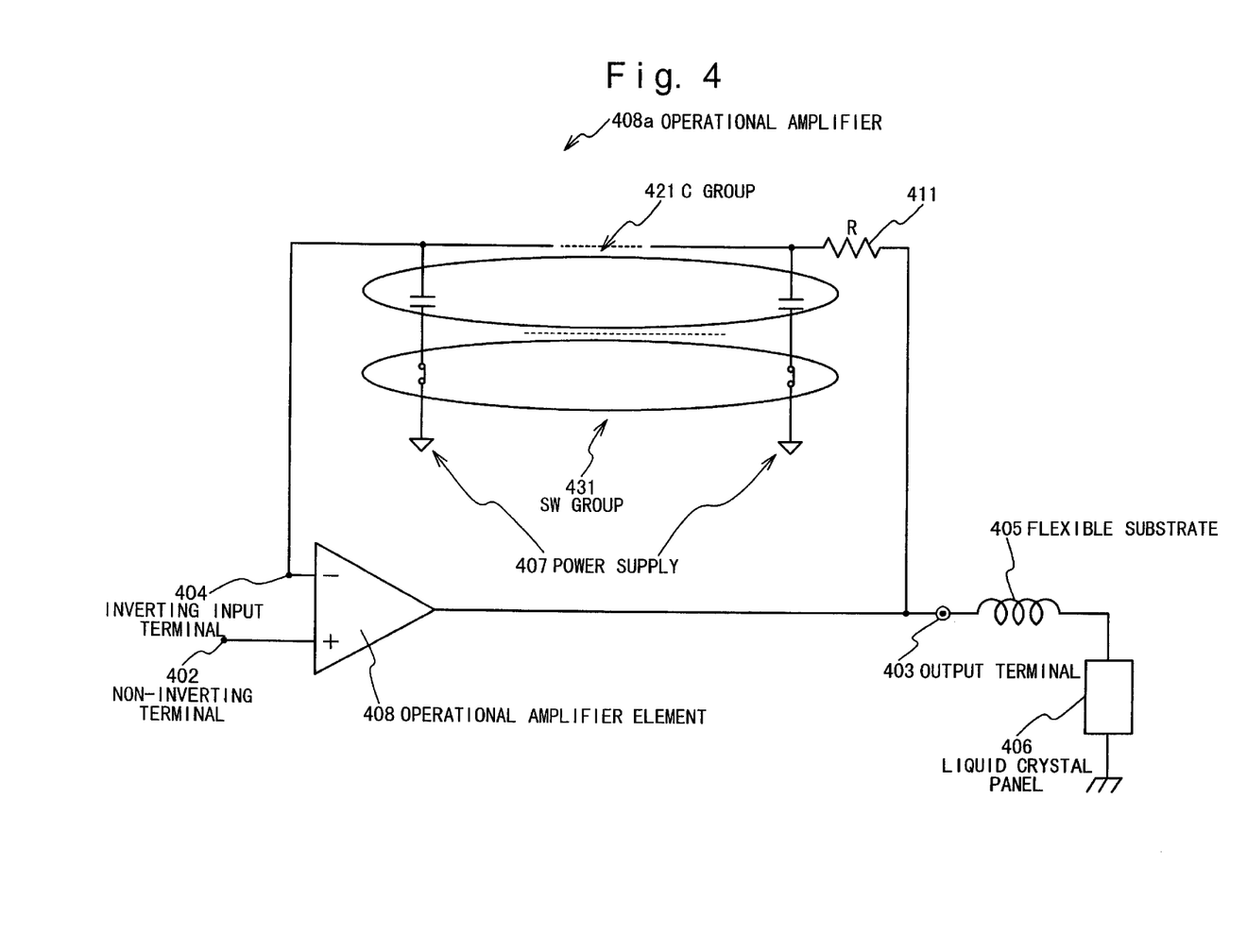
FIG. 4 is a view showing a configuration of an operational amplifier for driving a liquid crystal panel according to the fourth embodiment of the present invention.

The fourth embodiment according to the present invention will be described below with reference to FIG. 4. FIG. 4 is a view showing the configuration of an operational amplifier for driving a liquid crystal panel, according to the fourth embodiment of the present invention.

An operational amplifier 408a shown in FIG. 4 is provided with an operational amplifier element 408, a resistor group 411, a capacitor group 421 and a switch group (SW) 431. The operational amplifier element 408 is composed of a non-inverting input terminal 402, an output terminal 403 and an inverting input terminal 404. The resistor group 411 is composed of a plurality of resistors connected in series with one after another (between the inverting input terminal 404 and the output terminal 403). The capacitor group 421 is composed of a plurality of capacitors. The switch group 431 is composed of a plurality of switches.

The output terminal 403 is connected through the resistor group 411 to the inverting input terminal 404. One end of each capacitor of the capacitor group 421 is connected to the connection point between the resistors. The other end of each capacitor is connected through a switch corresponding in the switch group 432 to the power supply 407.

A negative feedback circuit is formed by the connection between the output terminal 403 and the inverting input terminal 404. The resistor group 411, the capacitor group 421 and the switch group 431 constitute a so-called low pass filter.

The output terminal 403 is connected through a flexible substrate 405 to a liquid crystal panel 406.

In the operational amplifier 408a having the above-mentioned configuration, a signal input to the non-inverting input terminal 402 is outputted through the operational amplifier 408, and controls the operation for charging and discharging the liquid crystal panel load 406 serving as the capacitance load. As for a feedback signal from the liquid crystal panel 406, an attenuation amount is adjusted by the capacitor selected by the resistor group 411 and the switch group 431. The feedback signal is attenuated in accordance with the attenuation in the resistor group 411 and the capacitor group 421.

By suitably controlling the on/off operations of the switch group 431, the synthesis capacitance of the capacitor group 421 can be defined in accordance with the reactance value of the flexible substrate 405.

Figure 5:
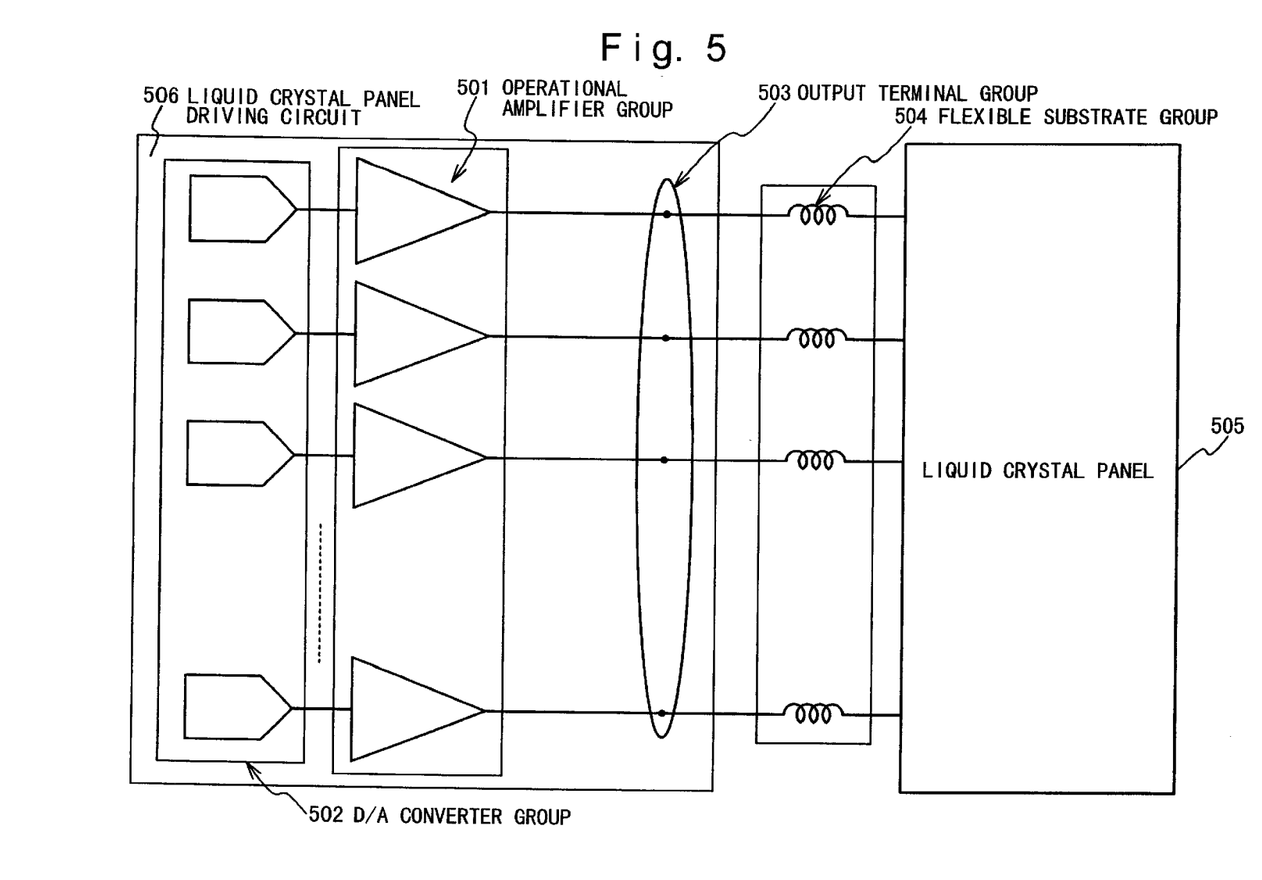
FIG. 5 is a view showing a configuration of the first liquid crystal panel driving circuit according to the present invention.

The configuration of a first liquid crystal panel driving circuit according to the present invention will be described below with reference to FIG. 5. FIG. 5 is a view showing the configuration of the first liquid crystal panel driving circuit according to the present invention.

A liquid crystal panel driving circuit 506 shown in FIG. 5 is provided with an operational amplifier group 501 composed of a plurality of operational amplifiers, a D/A converter group 502 composed of a plurality of D/A converters; and an output terminal group 503 composed of a plurality of output terminals. The D/A converter group 502 is connected to an input stage of the operational amplifier group 501.

The output terminal group 503 is connected to a liquid crystal panel 505 through a flexible substrate group 504 composed of a plurality of flexible substrates.

The operational amplifier group 501 is composed of the operational amplifiers 108a shown in FIG. 1 or the operational amplifiers 209a shown in FIG. 2. Thus, the output terminal of each operational amplifier of the operational amplifier group 501 is connected as the voltage follower so as to form the negative feedback circuit.

A picture signal (digital signal) outputted by a picture signal generator (not shown) is sent to the D/A converter group 502. This picture signal has data amounts in which its number corresponds to the number of pixels. The operational amplifier group 501 performs an impedance conversion on an analog signal outputted by the D/A converter group 502. The operational amplifier group 501 charges and discharges the liquid crystal panel 505 serving as the capacitance load, on the basis of the signal on which the impedance conversion is performed.

A feedback signal from the liquid crystal panel 505 is attenuated by the negative feedback circuit of the operational amplifier group 501.

Figure 6:
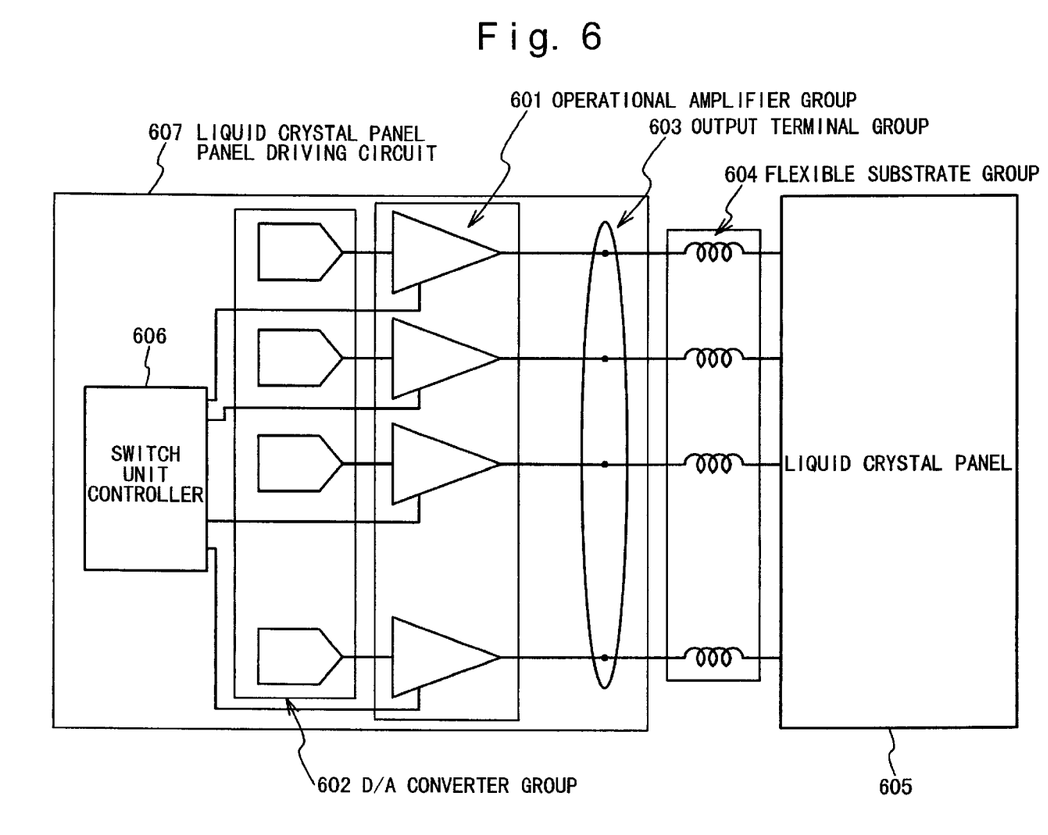
FIG. 6 is a view showing a configuration of the second liquid crystal panel driving circuit according to the present invention.

Here, a configuration of a second liquid crystal panel driving circuit according to the present invention will be described below with reference to FIG. 6. FIG. 6 is a view showing the configuration of the second liquid crystal panel driving circuit according to the present invention.

A liquid crystal panel driving circuit 607 shown in FIG. 6 is provided with an operational amplifier group 601 composed of a plurality of operational amplifiers, a D/A converter group 602 composed of a plurality of D/A converters, an output terminal group 603 composed of a plurality of output terminals, and a switch unit controller 606. The D/A converter group 602 is connected to an input stage of the operational amplifier group 601. The switch unit controller 606 is connected to the operational amplifier group 601

The output terminal group 603 is connected to a liquid crystal panel 605 through a flexible substrate group 604 composed of a plurality of flexible substrates.

The operational amplifier group 601 is composed of the operational amplifiers 308a shown in FIG. 3 or the operational amplifiers 408a shown in FIG. 4. Thus, the output terminal of each operational amplifier of the operational amplifier group 601 is connected as the voltage follower so as to form the negative feedback circuit. Also, the on/off controls of the first switch group 331, the second switch group 332 and the switch group 431 are carried out in accordance with the control of the switch unit controller 606. The synthesis capacitance of the capacitor groups 321, 421 is suitably defined in accordance with the on/off controls.

The operational amplifier group 501 performs the impedance conversion on an analog signal outputted by the D/A converter group 502. The operational amplifier group 501 charges and discharges the liquid crystal panel 505 serving as the capacitance load, on the basis of the signal on which the impedance conversion is performed.

The feedback signal from the liquid crystal panel 505 is attenuated by the negative feedback circuit of the operational amplifier group 501

Figure 7A:
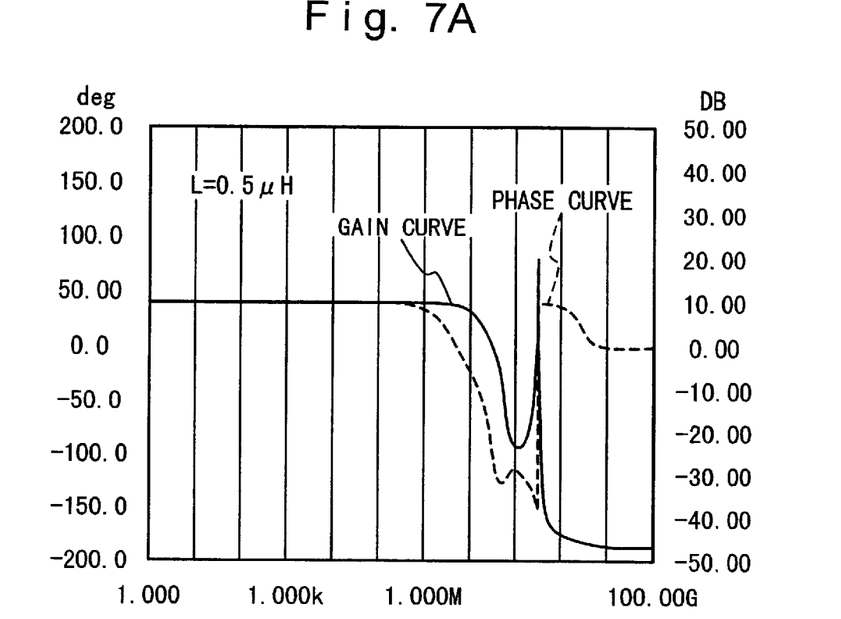
FIG. 7A is a view showing a property wave form when a low pass filter according to the present invention is not actuated.
Figure 7B:
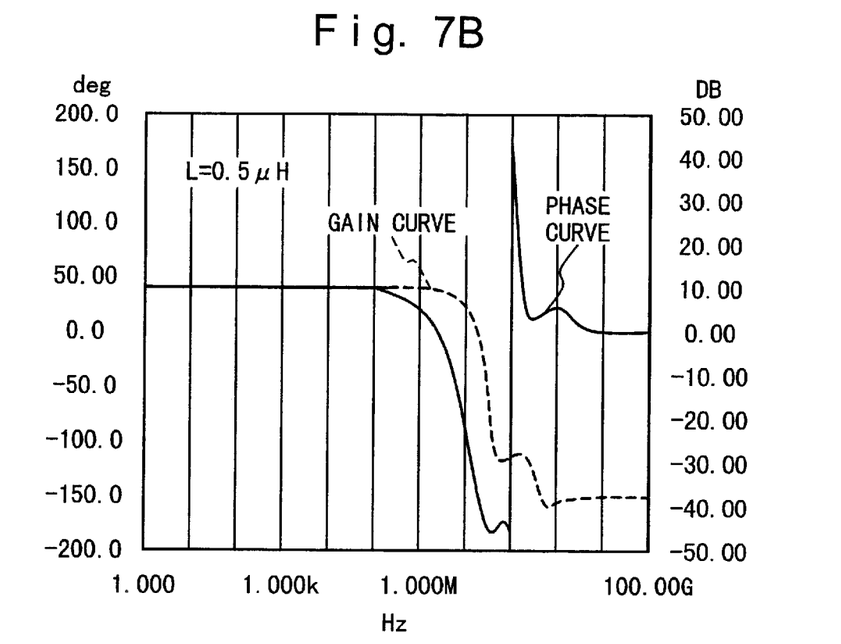
FIG. 7B is a view showing a property wave form when the low pass filter according to the present invention is actuated.

The operational property of the liquid crystal panel driving circuit according to the present invention will be described below with reference to FIGS. 7A, 7B. FIG. 7A shows a wave form when a low pass filter according to the present invention is not actuated. FIG. 7B shows a wave form when a low pass filter according to the present invention is actuated.

FIGS. 7A, 7B show the wave forms in a case of a flexible substrate inductance value L=0.5 $\mu$ H. In FIGS. 7A, 7B, a horizontal axis indicates a frequency of a drive signal, and a vertical axis indicates a phase value corresponding to a phase curve and a gain value corresponding to a gain curve.

In FIGS. 7A, 7B, the gain curve indicate the gain of the operational amplifier with respect to each frequency. In FIGS. 7A, 7B, the phase curve indicate a phase difference between a non-inverting input and an inverting input of the operational amplifier with respect to each frequency.

In FIGS. 7A, 7B, the situation is induced in which the phase curve is changed by about 0 to 180 degrees, associated with the increase in the frequency. In this situation, the gain of "1" or more causes the oscillation of the operational amplifier.

In FIG. 7A, in the situation in which the phase curve is changed by about 0 to 180 degrees, the gain is increased to "1" or more. The oscillation of the operational amplifier occurs in the operational amplifier (the conventional liquid crystal panel driving circuit) having such property.

On the other hand, in FIG. 7B, the situation having the gain of "1" or more is not present in any frequency. Thus, the oscillation corresponding to the frequency does not occur in the operational amplifier according to the present invention.

As mentioned above, the liquid crystal panel driving circuit according to the present invention can avoid the influence of the inductance component in the flexible substrate, on the basis of the capacitance of the feedback circuit. Thus, it is possible to prevent the oscillation of the operational amplifier that is caused by the inductance component.

As mentioned above, the liquid crystal panel driving circuit according to the present invention can avoid the oscillation of the operational amplifier or the distortion of the output without any deterioration in the speed when the liquid crystal panel is driven and the static current, even if the inductance component of the flexible substrate that is the medium combined by the liquid crystal panel driving circuit and the liquid crystal panel is large.

According to the above-mentioned configuration, if a latter stage of the operationally driving amplifier indicates the high impedance state because of the inductance component in the high frequency band, the feedback signal is attenuated by the load connected to the negative feedback circuit. Due to this action of the attenuation, the operational amplifier is protected against the oscillation, and it is stably operated. Incidentally, in the configuration according to the present invention, the capacitor and the resistor are not connected in series between the liquid crystal panel and the output terminal of the operational amplifier. So, the speed when the liquid crystal panel is driven is not deteriorated. Moreover, there is no technical idea of increasing the current supplied to the operational amplifier and thereby making the operational amplifier stable. Hence, the static current value is never increased.

What is claimed is:

1. A liquid crystal panel driving circuit comprising:
    an operational amplifier which outputs an output signal based on an image signal and a feedback signal corresponding to said output signal without a high frequency content; and
    a flexible substrate with an inductance wherein said output signal passes through to a liquid crystal display via said inductance.

2. The liquid crystal panel driving circuit according to claim 1, wherein said operational amplifier comprises:
    an operational amplifier element comprising a non-inverting input terminal supplied with said image signal, an inverting input terminal supplied with said feedback signal and an output terminal outputting said output signal; and
    a negative feedback circuit formed between said output terminal and said inverting input terminal.

3. The liquid crystal panel driving circuit according to claim 2, wherein said negative feedback circuit comprises a low pass filter attenuating said high frequency content.

4. The liquid crystal panel driving circuit according to claim 3, wherein said low pass filter comprises;
    a resistor connected between said inverting input terminal and said output terminal; and
    a capacitor connected between said inverting input terminal and a power supply.

5. The liquid crystal panel driving circuit according to claim 3, wherein said low pass filter comprises:
    a plurality of resistors connected in series between said inverting input terminal and said output terminal; and
    a plurality of capacitors connected in parallel to each other through said resistors, wherein one end of said each of said plurality of capacitors is connected to a connection point between said resistors and the other end of said each capacitor is connected to a power supply.

6. The liquid crystal panel driving circuit according to claim 5, wherein said low pass filter further comprises:
    a plurality of switches, wherein each of said plurality of switches sets an active state and an inactive state of a corresponding one of said plurality of capacitors.

7. The liquid crystal panel driving circuit according to claim 6, further comprising:
    a control circuit controlling an active state and an inactive state of said each switch so as to set a synthesis capacitance of said plurality of capacitors, based on said inductance of said flexible substrate.

8. The liquid crystal panel driving circuit according to claim 7, further comprising:
    a D/A converter converting a digital image signal to an analog image signal as said image signal.

9. A method of driving a liquid crystal panel comprising:
    amplifying an image signal as an output signal;
    supplying a liquid crystal display with said output signal; and
    feeding back a feedback signal based on said output signal without a high frequency content.

10. The method according to claim 9, wherein said amplifying comprises:

supplying an operational amplifier element with said image signal and said feedback signal; and amplifying said image signal based on said image signal and said feedback signal by said operational amplifier element.

11. The method according to claim 10, wherein said supplying comprises:

supplying said output signal that passes through a flexible substrate with an inductance to said liquid crystal display via said inductance.

12. The method according to claim 11, wherein said feeding back comprises:

feeding back said feedback to said operational amplifier element, wherein said high frequency content signal is attenuated.

13. A method of reducing an amplifier oscillation in a liquid crystal panel driving circuit, said method comprising:

providing a flexible substrate having an inductive reactance; and incorporating a filter circuit in a feedback loop of an operational amplifier that drives a liquid crystal panel via said flexible substrate, said filter reducing an effect of said inductive reactance.

14. The method according to claim 13, further comprising:

shunting a high frequency component with said filter circuit, said filter circuit comprising a low pass filter.

15. The method according to claim 13, wherein said filter circuit includes at least one switch to incapacitate one or more elements of said filter circuit.

16. The method according to claim 14, wherein said low pass filter comprises a resistor circuit interconnected between an inverting input terminal of said operational amplifier and a capacitor interconnected between said resistor circuit and a power supply ground node.

17. A display apparatus comprising:

a liquid crystal panel;

an operational amplifier providing a drive signal to said liquid crystal panel; and a flexible substrate through which said drive signal is carried to said liquid crystal panel from said operational amplifier, wherein said operational amplifier incorporates a filter circuit in a feedback loop to reduce an effect of an inductance of said flexible substrate.

18. The display apparatus of claim 17, wherein said filter circuit comprises a low pass filter.

19. The display apparatus of claim 17, wherein said filter circuit includes at least one switch to incapacitate at least a portion of said filter circuit.

20. The display apparatus of claim 18, wherein said low pass filter comprises a resistor circuit interconnected between an inverting input terminal of said operational amplifier and a capacitor interconnected between said resistor circuit and a power supply ground node.

21. The display apparatus of claim 17, wherein any of a capacitor in said filter circuit is not connected serially in said drive signal, thereby allowing a speed of said drive signal to not be affected by a serially-connected capacitance.

* * * * *